United States Patent
Oud et al.

[11] Patent Number: 6,086,687
[45] Date of Patent: Jul. 11, 2000

[54] LEAD-FREE TIN ALLOY

[75] Inventors: Martinus Adrianus Oud, Krimpen a/d IJssel, Netherlands; Roger Bilham, Bromley, United Kingdom

[73] Assignee: Alpha Fry, Limited, United Kingdom

[21] Appl. No.: 09/014,754

[22] Filed: Jan. 28, 1998

[51] Int. Cl.[7] .................................................. C22C 13/00
[52] U.S. Cl. ......................... 148/400; 420/560; 420/561; 420/562
[58] Field of Search .................................. 420/557, 560, 420/561, 562; 148/400

[56] References Cited

FOREIGN PATENT DOCUMENTS

| 715927 | 6/1996 | European Pat. Off. . |
| 2713196 | 10/1978 | Germany . |
| 3147226 | 6/1983 | Germany . |
| 56165588 | 12/1981 | Japan . |
| 57030598 | 6/1982 | Japan . |
| 2179387 | 7/1990 | Japan . |
| 4002739 | 1/1992 | Japan . |
| 6344180 | 12/1994 | Japan . |
| 115725 | 7/1982 | Poland . |

*Primary Examiner*—Sikyin Ip
*Attorney, Agent, or Firm*—Mintz, Levin, Cohn, Ferris, Glovsky and Popeo, P.C.

[57] ABSTRACT

A lead-free tin alloy for solder joints comprising up to 0.25% by weight of indium and a grain refiner which is an alloy consisting of, by weight, 2.5 to 10% aluminium, 1 to 5% magnesium and balance zinc. The alloys have improved mechanical properties, such as creep strength, and an improved thermal fatigue strength.

10 Claims, 5 Drawing Sheets

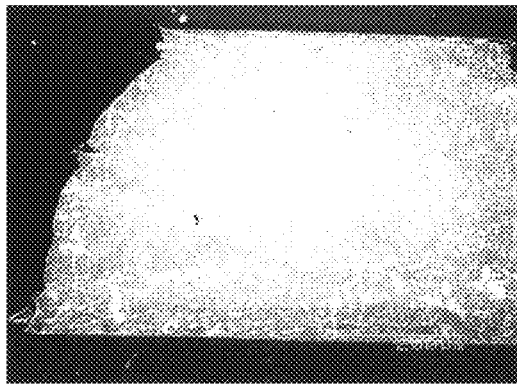
REFERENCE 1
BALL AT EDGE OF PACKAGE
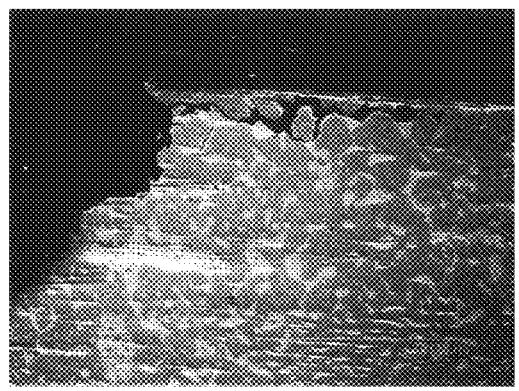
REFERENCE 1
BALL BENEATH SILICON DIE
FIG. 2.

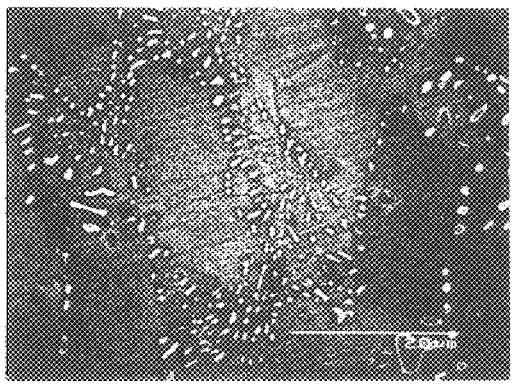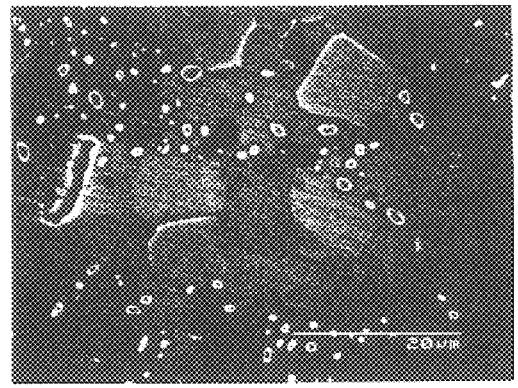
FIG. 3.

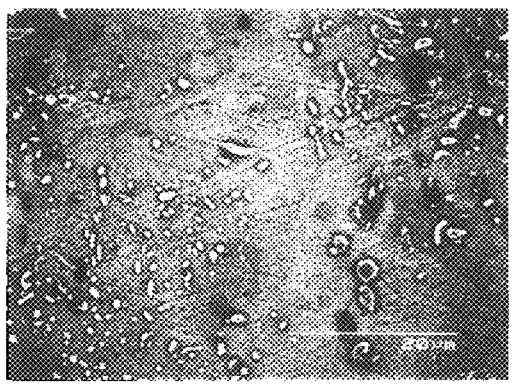 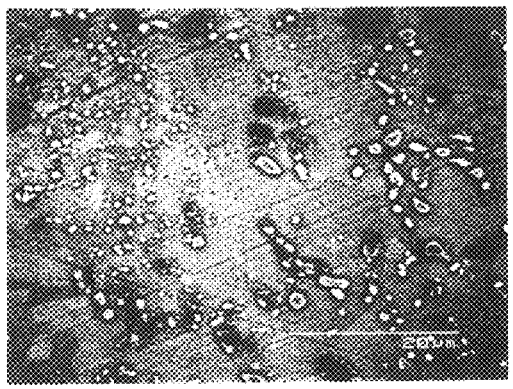
Alloy 16  Alloy 16
CENTRE OF BALL  CORNER OF BALL
FIG. 4.

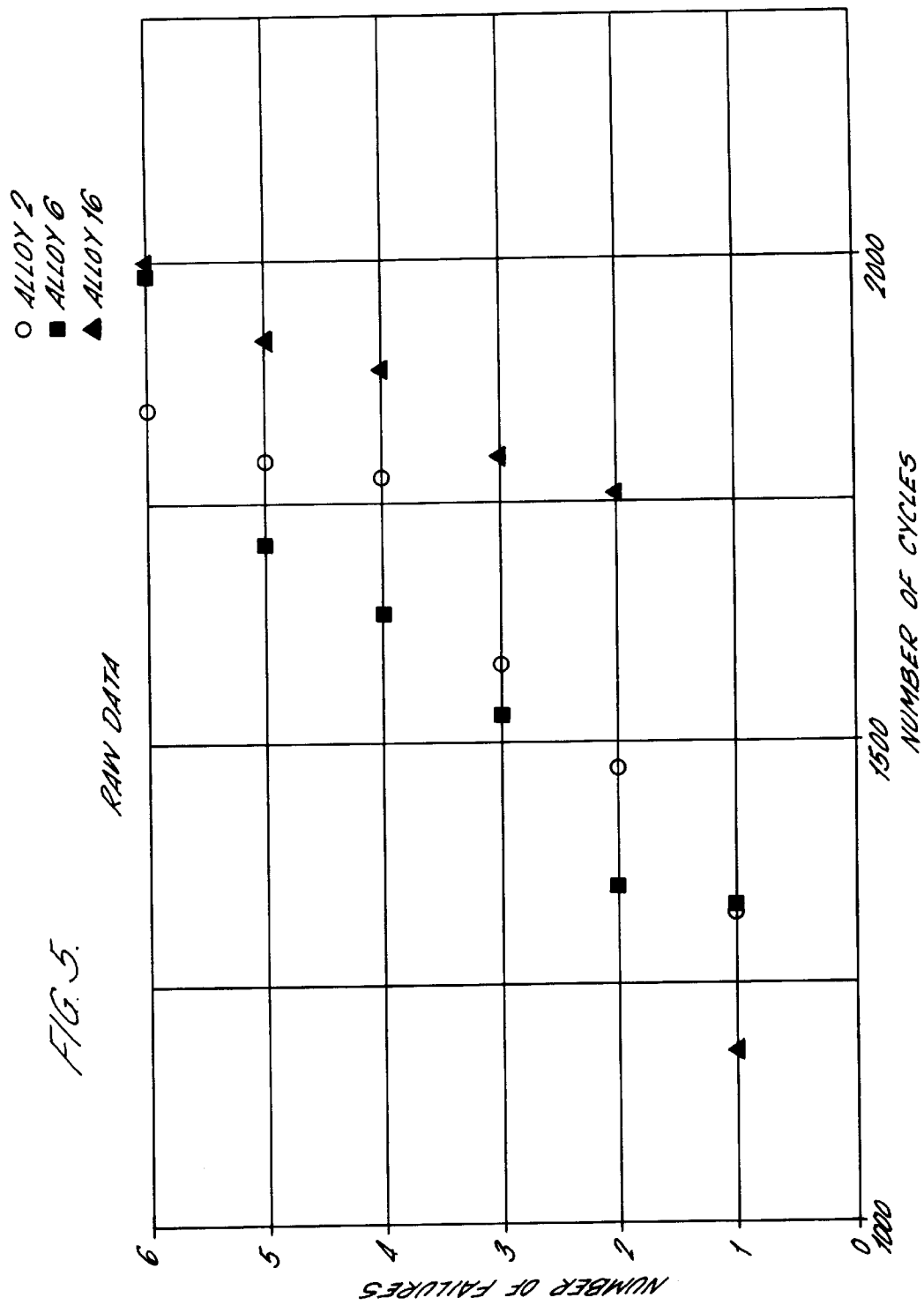

LEAD-FREE TIN ALLOY

BACKGROUND OF THE INVENTION

The present invention relates to lead-free tin alloys for solder joints with improved mechanical properties, such as creep strength, and improved thermal fatigue strength, and to lead-free solders based on such alloys.

Solder joints are critical in many electronic devices. Furthermore, there is an increasing demand from the automotive industry for electronic devices with improved thermal fatigue strength at increasingly higher operating temperatures.

Many solders are based on tin-lead alloys, but the toxicity of lead in industrial processes, products and as waste at the end of product life, is of great environmental and health concern.

DE-A-2713196 and DE-A-3147226 disclose the use of zinc-aluminium-magnesium alloys as grain refiners in cast tin-based pewter and bearing alloys. The tin alloys do not contain indium and are not alloys for solder joints.

EP-A-0702095 discloses an alloy for a slide bearing which comprises Sn, Cu, Sb, Ni, In and Eutinal, Ag or Ti. The alloy generally comprises from 0.3 to 2% by weight of indium, with an amount of 1.5% by weight of indium being particularly preferred for use.

Lead-free alloys have been developed. For example a tin/silver alloy with respective weight percentages of 96.5% tin and 3.5% silver is known for reflow soldering.

A further example of a lead-free alloy, used for wave soldering, is a eutectic tin/copper alloy consisting of 99.3 wt % tin and 0.7 wt % copper, respectively.

A still further example of a lead-free alloy, used for soldering, is an alloy consisting of 96.2 wt % tin, 2.5 wt % silver, 0.8 wt % copper and 0.5 wt % antimony.

Tin-lead solder alloys have widespread applications for example as ball grid arrays in mounting silicon chips on printed circuit boards. These ball-grid arrays must have sufficient thermal fatigue strength in order to be able to withstand a temperature difference between the component and the circuit board of up to 150° C. over a width of about 4 cm, during turning the circuit on and off. If the thermal fatigue strength of the solder joints is not sufficient, there is a coarsening of the micro-structure of the solder. Subsequently crack initiation and crack propagation occur, which lead in turn to loss of electrical contact between the chip and the printed circuit board.

Accordingly, a problem with the known lead-free tin solder alloys is their thermal fatigue strength.

SUMMARY OF THE INVENTION

We have now developed lead-free tin alloys which contain small amounts of indium, which have an improved thermal fatigue strength, as compared to known lead free tin alloys.

According to a first aspect of the present invention there is provided a lead-free tin alloy for solder joints comprising up to 0.25% by weight of indium and a grain refiner which is an alloy consisting of, by weight, 2.5 to 10% aluminium, 1 to 5% magnesium and balance zinc.

Tin has a tetragonal crystal structure which offers more resistance to deformation than metals with cubic crystal structure, such as lead.

This means that tin is less ductile than lead whereby tin is accordingly less susceptible to plastic deformation when subjected to high temperatures.

Furthermore, it has been theorized that the lead and tin components of lead tin alloys separate out on casting into lead rich and tin rich areas which yield a fine crystal structure resulting in an improved utility with respect to tin.

Accordingly, this micro-structure is able to absorb substantial plastic deformation without cracking, i.e. it has a good thermal fatigue strength.

We have found that by adding the above-defined grain refiner generally known as Eutinal instead of lead, a fine crystal micro-structure can be obtained. An alloy according to the invention has a fine pinned crystal micro-structure which delays the recrystallisation or crystal coarsening process induced by thermal deformation. A good thermal fatigue strength is obtained thereby.

The grain refiner for use in the invention is Eutinal, which can be present in the alloy in a wt % range of up to 0.5%, preferably 0. 1% or less and most preferably in a wt % range of from 0.01 to 0.06%.

During casting of the tin alloy, enlarging of the tin crystals is slowed down by Eutinal as a grain refiner, whereby a fine micro-crystal structure is maintained. The inventors have achieved good thermal fatigue strength with such an alloy.

The tin alloy of the present invention may furthermore comprise silver and/or copper, with tin being present in the alloy in an amount of at least 90 wt %, the balance being made up ot Eutinal present in the wt % ranges as discussed above, silver and/or copper and/or bismuth and/or antimony.

We have found that a tin alloy comprising silver and Eutinal has a thermal fatigue strength equivalent to known tin-lead alloys, and much better than tin alloys comprising silver alone. The alloys of the present invention comprise indium in an amount of up to 0.25% by weight, preferably in an amount of up to 0.2% by weight. The alloys of the present invention may also comprise titanium in an amount of up to 0.2% by weight, and/or zinc in an amount of up to 0.2% by weight.

The alloys of the present invention are prepared by techniques known to those skilled in the art. For example, a master alloy of Eutinal may be prepared at a temperature of about 600° C. by melting the zinc, adding the aluminium and magnesium and stirring to dissolve to form a uniform alloy which is cast into moulds.

A master alloy of Eutinal in tin may be prepared, containing 6 to 12% zinc, 0.1 to 1% aluminium and 0.08 to 0.6% magnesium by weight, by adding Eutinal alloy to molten tin to form a master alloy which is cast into moulds. The final lead free alloy may then be prepared by firstly melting tin metal and adding thereto the main alloying metals, i.e. indium and any other alloying metals to form a molten mixture thereof The master alloy of Eutinal/tin is then added to the molten mixture.

Alternatively, the step of preparing a master alloy of Eutinal/tin may be omitted and the Eutinal added directly to the molten lead free alloy prepared as described above.

BRIEF DESCRIPTION OF THE DRAWINGS

The present invention will be further described with reference to the accompanying drawings, in which:

FIG. 2 shows two scanning electron micrographs of solder balls made of a reference alloy after being subjected to thermal fatigue trials;

FIG. 3 shows two scanning electron micrographs of solder balls made of a comparative alloy after being subjected to thermal fatigue trials;

FIG. 4 shows two scanning electron micrographs of solder balls made of one embodiment of the alloy of the present invention after being subjected to thermal fatigue trials;

FIG. 5 is the data of the results of the thermal fatigue trials.

Figure 1:
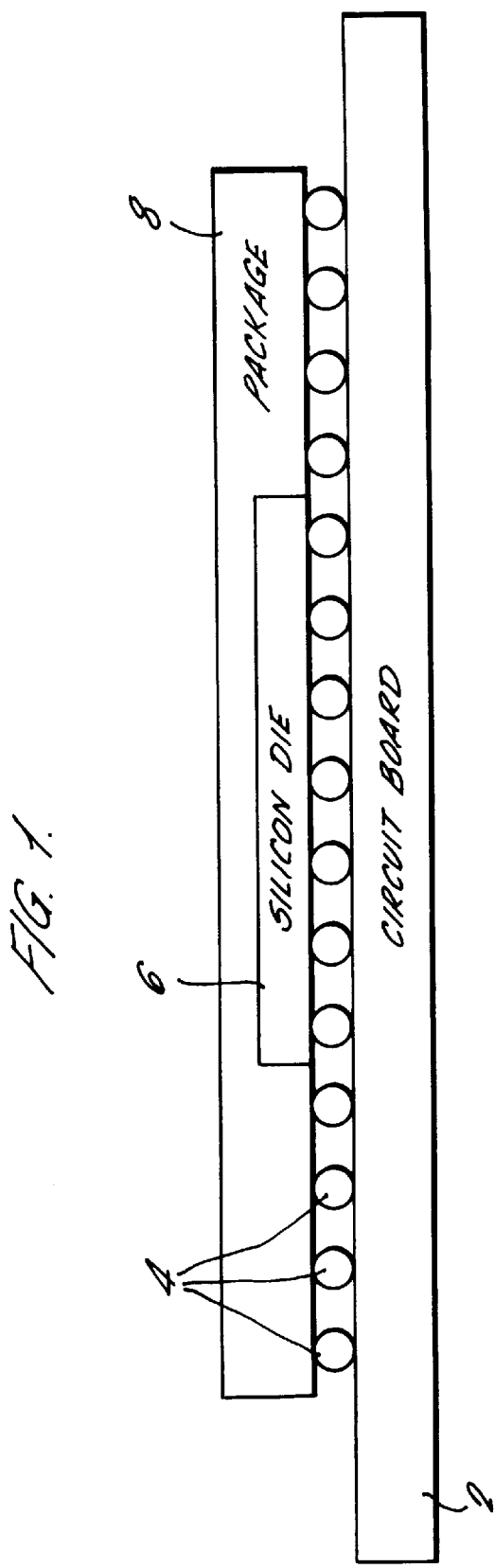
FIG. 1 is a cut away side view of an assembly subjected to thermal fatigue trials.

The present invention will be further described with reference to the following Example.

EXAMPLE

Four alloys were formulated according to known techniques, the compositions of which are given in Table 1 below. In the Table "Eut" refers to a Eutinal alloy of the composition 5% aluminium, 2.5% magnesium and balance zinc.

TABLE 1

| Ref 1 | SnAg2Pb36 (Comparative) |
|---|---|
| No. 2 | SnAg3.5 (Comparative) |
| No. 6 | SnAg3.5 In0.2 (Comparative) |
| No. 16 | SnAg3.5 In0.2 Eut 0.035 |

These alloys were subsequently assembled into ball grid arrays (BGAs) according to known techniques, which were used to mount silicon die packages in the assemblies as shown in FIG. 1.

The assemblies comprised a circuit board 2, a grid array of solder balls 4, a silicon die 6 and a package 8.

Six assemblies of each alloy were subjected to up to 3000 thermal fatigue cycles, each cycle consisting of 15 minutes held at +125° C., 15 minutes ramping to −40° C., 15 minutes held at −40° C. and 15 minutes ramping to +125° C.

Following the thermal fatigue cycling, scanning electron micrographs, FIGS. 2–4, were taken of the solder balls.

The silicon die ball grid array package (Amkor 225 BGA) was used in order to investigate the characteristics of the solder under a large strain.

An assembly was considered to have failed when the electrical resistance of any joint became greater than 5 ohms.

The scanning electron micrographs show the nature and extent of microstructural change of the alloys.

Discussion of the Micrographs

Typical micrographs of the reference alloy 1 are shown in FIG. 2. These illustrate a coarsening of the microstructure and crack initiation at the top corners of the balls where they join onto the silicon die package. These are the areas of highest strain during thermal cycling, which suggests that the solder microstructure is affected by the strain environment.

FIG. 3 shows the effect of strain on alloy No. 2. The intermetallic compound distribution is much coarser at the highly strained corner of the ball than at the less strained center of the ball.

This effect was also seen in alloy 6, but not in alloy 16, which is shown in FIG. 4. Here the intermetallic compound distribution does not appear to be significantly affected by the strain environment. These results are based on the observation of several different solder balls.

Statistical Analysis of the Thermal Fatigue Results

The raw data from the trials is reproduced in FIG. 5. This shows the number of failures in each package against the number of thermal cycles completed. The results were interpreted using Weibull statistics to give an indication of the failure probabilities associated with each alloy. The values should be treated as estimates, as the number of data points for each alloy is limited.

The value of "Weibull modulus" for each alloy tested is shown in Table 2. A high Weibull modulus shows that there is a small spread in the results, while a low Weibull modulus shows that there is a large spread in the results. Alloy 6 has the lowest modulus (largest spread) whilst, among the lead-free alloys, alloy 16 has the highest modulus (smallest spread).

Weibull statistics can also be used to predict the number of cycles to a particular failure probability. The calculated number of cycles to 1% failure is also given in Table 2. This again shows alloy 16 to be the best of the lead-free alloys tested.

TABLE 2

| Alloy | Weibull Modulus | Intercept | Cycles to 1% failure (calculated) |
|---|---|---|---|
| Ref. 1 | 24.35 ± 3.1 | −186.5 | 1758 |
| No. 2 | 6.68 ± 0.7 | −51.3 | 890 |
| No. 6 | 5.76 ± 0.9 | −42.9 | 768 |
| No. 16 | 20.05 ± 3.2 | −151.2 | 1494 |

What is claimed is:

1. A lead-free solder consists of:
   a) indium in an amount of greater than zero and up to 0.25% by weight;
   b) a grain refiner in an amount of from 0.01% to 0.5% by weight, said grain refiner consisting of, by weight, 2.5 to 10% aluminum, 1 to 5% magnesium and 85 to 96.5% zinc;
   c) up to about 9.25% of metals selected from the group consisting of silver, copper, bismuth, antimony, zinc, titanium, and combinations thereof; and
   d) the balance tin.

2. A lead-free tin solder alloy as claimed in claim 1, wherein the grain refiner is present in an amount of up to 0.2% by weight.

3. A lead-free tin solder alloy as claimed in claim 1, wherein the grain refiner is present in an amount of up 0.1% by weight.

4. A lead-free tin solder alloy as claimed in claim 1, wherein the grain refiner is present in an amount of from 0.01% to 0.06% by weight.

5. A lead-free tin solder alloy as claimed in claim 1 comprising at least 90 wt % tin.

6. A lead-free tin solder alloy as claimed in claim 1 which further consists of titanium in an amount of up to 0.2% by weight.

7. A lead-free tin solder alloy as claimed in claim 1 which further consists of additional zinc in an amount of up to 0.2% by weight.

8. A lead-free tin solder alloy as claimed in claim 1 having up to 0.2% by weight of indium.

9. A ball grid array (BGA) for arranging electronic components on circuit boards in which said BGA comprises an alloy as recited in claim 1.

10. A joint between an electronic component and a circuit board which comprises an alloy as recited in claim 1.

* * * * *